(12) United States Patent
Cavanagh et al.

(10) Patent No.: US 7,231,338 B2
(45) Date of Patent: Jun. 12, 2007

(54) DISTRIBUTED SIMULATION SYSTEM HAVING PHASES OF A TIMESTEP

(75) Inventors: Carl Cavanagh, Oakland, CA (US); Steven A. Sivier, Fremont, CA (US); Carl B. Frankel, San Francisco, CA (US); James P. Freyensee, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 864 days.

(21) Appl. No.: 10/010,572

(22) Filed: Nov. 9, 2001

(65) Prior Publication Data

US 2003/0093257 A1 May 15, 2003

(51) Int. Cl.
*G06F 17/50* (2006.01)
*G06F 9/46* (2006.01)
*G06G 7/62* (2006.01)

(52) U.S. Cl. ............... 703/16; 703/13; 703/14; 703/15; 703/17; 718/106

(58) Field of Classification Search .......... 703/13–17; 718/106

See application file for complete search history.

(56) References Cited

U.S. PATENT DOCUMENTS

| | | | |
|---|---|---|---|
| 4,456,994 A | 6/1984 | Segarra | |
| 4,590,581 A | 5/1986 | Widdoes, Jr. ............ 703/2 |
| 4,821,173 A | 4/1989 | Young et al. | |
| 4,937,173 A | 6/1990 | Kanda et al. | |
| 5,185,865 A | 2/1993 | Pugh | |
| 5,247,650 A | 9/1993 | Judd et al. ............ 703/20 |
| 5,327,361 A | 7/1994 | Long et al. | |
| 5,339,435 A | 8/1994 | Lukin et al. | |
| 5,398,317 A | 3/1995 | Nugent | |
| 5,442,772 A | 8/1995 | Childs et al. | |
| 5,455,928 A | 10/1995 | Herlitz | |
| 5,466,200 A | 11/1995 | Ulrich et al. ............ 482/4 |
| 5,519,848 A | 5/1996 | Wloka et al. | |
| 5,625,580 A | 4/1997 | Read et al. | |

(Continued)

OTHER PUBLICATIONS

Agrawal, P. et al. "A Hardware Logic Simulation System," IEEE Transactions on CAD of Integrated Circuits and Systems. Jan. 1990. vol. 9, Issue 1, pp. 19-29.*

(Continued)

*Primary Examiner*—Paul Rodriguez
*Assistant Examiner*—Ayal Sharon
(74) *Attorney, Agent, or Firm*—Lawrence J. Merkel; Meyertons, Hood, Kivlin, Kowert & Goetzel, P.C.

(57) ABSTRACT

A distributed simulation system is provided in which timesteps may be divided into a first phase (referred to as the zero time phase herein) and a second phase (referred to as the real time phase herein). In the first phase, each distributed simulation node in the system may process one or more received commands without causing the simulator to evaluate the model in that distributed simulation node. In the second phase, each distributed simulation node may cause the simulator to evaluate the model in response to a command supplying one or more signal values to the model. In one embodiment, the second phase may iterate the evaluation of the model for each command received which supplies signal values. Each iteration may optionally include transmitting a command including the output signal values produced by the model during that iteration.

31 Claims, 10 Drawing Sheets

U.S. PATENT DOCUMENTS

| | | | |
|---|---|---|---|
| 5,634,010 | A | 5/1997 | Ciscon et al. |
| 5,715,184 | A | 2/1998 | Tyler et al. |
| 5,732,247 | A | 3/1998 | Dearth et al. |
| 5,751,941 | A | 5/1998 | Hinds et al. |
| 5,794,005 | A | 8/1998 | Steinman |
| 5,812,824 | A | 9/1998 | Dearth et al. |
| 5,838,948 | A | 11/1998 | Bunza ........................ 703/27 |
| 5,848,236 | A | 12/1998 | Dearth et al. |
| 5,850,345 | A | 12/1998 | Son |
| 5,870,585 | A | 2/1999 | Stapleton |
| 5,875,179 | A | 2/1999 | Tikalsky |
| 5,881,267 | A | 3/1999 | Dearth et al. |
| 5,889,954 | A | 3/1999 | Gessel et al. ............... 709/223 |
| 5,892,957 | A | 4/1999 | Normoyle et al. |
| 5,893,155 | A | 4/1999 | Cheriton ..................... 711/144 |
| 5,907,685 | A | 5/1999 | Douceur |
| 5,907,695 | A | 5/1999 | Dearth |
| 5,910,903 | A | 6/1999 | Feinberg et al. |
| 5,973,638 | A | 10/1999 | Robbins et al. ............. 342/172 |
| 5,991,533 | A | 11/1999 | Sano et al. |
| 6,031,907 | A | 2/2000 | Damani et al. ........ 379/413.04 |
| 6,031,987 | A | 2/2000 | Damani et al. |
| 6,053,947 | A | 4/2000 | Parson |
| 6,117,181 | A | 9/2000 | Dearth et al. |
| 6,134,234 | A | 10/2000 | Kapanen |
| 6,289,398 | B1 | 9/2001 | Stallmo et al. ................ 710/5 |
| 6,345,242 | B1 | 2/2002 | Dearth et al. |
| 6,507,809 | B1 | 1/2003 | Yoshino et al. ............... 703/21 |
| 6,711,411 | B1 | 3/2004 | Ruffini |
| 6,748,451 | B2 | 6/2004 | Woods et al. |
| 7,020,722 | B2 * | 3/2006 | Sivier et al. ................ 709/248 |
| 2003/0093252 | A1 * | 5/2003 | Frankel et al. ................ 703/13 |
| 2003/0093253 | A1 * | 5/2003 | Freyensee et al. ............ 703/13 |
| 2003/0093254 | A1 * | 5/2003 | Frankel et al. ................ 703/13 |
| 2003/0093255 | A1 * | 5/2003 | Freyensee et al. ............ 703/13 |
| 2003/0093256 | A1 * | 5/2003 | Cavanagh et al. ............ 703/14 |
| 2003/0093569 | A1 * | 5/2003 | Sivier et al. ................ 709/248 |

OTHER PUBLICATIONS

Agrawal, P. et al. "Architecture and Design of the MARS Hardware Accelerator." Proc. of the 24th ACM/IEEE Conf. on Design Automation. 1987. pp. 101-107.*

Jerry Banks, ed.; Handbook of Simulation; 1998; John Wiley & Sons, Inc.; pp. 3-51.

Robert W. Sebesta, Concepts of Programming Language, 1999 Addison Wesley L9ongman, Inc., Fourth Edition, pp. 105-131.

"Office Communication" for U.S. Appl. No. 10/008,643 mailed Feb. 18, 2005 (10 pages).

"Rule Base Driven Conversion of an Object Oriented Design Structure Into Standard Hardware Description Languages," Verschueren, A.C., IEEE Xplore, appears in Euromicro Conference, 1998, Proceedings. 24th, vol. 1, Aug. 25, 1998, pp. 42-45.

"Modeling Communication with Objective VHDL," Putzke, et al., IEEE Xplore, appears in Verilog HDL Conference and VHDL International Use Forum, 1998, IVC/VIUF, Proceedings., 1998 International, Mar. 16, 1998, pp. 83-89.

"A Procedural Language Interface for VHDL and its Typical Applications," Martinolle, et al., IEEE Xplore, appears in Verilog HDL Conference and VHDL International Use Forum, 1998, IVC/VIUF, Proceedings., 1998 International, Mar. 16, 1998, pp. 32-38.

"The Verilog Procedural Interface for the Verilog Hardware Description Language," Dawson, et al., IEEE Xplore, appears in Verilog HDL Conference, 1996, Proceedings., 1996 International, Feb. 26, 1996, pp. 17-23.

"An Integrated Environment for HDL Verification," York, et al., IEEE Xplore, appears in Verilog HDL Conference, 1995, Proceedings., 1995 International, Mar. 27, 1995, pp. 9-18.

"The PowerPC 603 C++ Verilog Interface Model," Voith, R.P., IEEE Xplore, appears in Compcon Spring '94, Digest of Papters, Feb. 28, 1994, pp. 337-340.

Networked Object Oriented Verification with C++ and Verilog, Dearth, et al., IEEE XP-002144328, 1998, 4 pages.

Patent Abstracts of Japan, publication No. 10326835, published Dec. 8, 1998.

Patent Abstracts of Japan, publication No. 10049560, published Feb. 20, 1998.

Patent Abstracts of Japan, publication No. 10340283, published Dec. 22, 1998.

Patent Abstracts of Japan, publication No. 07254008, published Oct. 3, 1995.

"Multiprocessing Verilog Simulator Exploits the Parallel Nature of HDLs." Lisa Maliniak, Electronic Design, Abstract, May 30, 1994, 1 page.

"It's A Multithreaded World, Part I," Charles J. Northrup, BYTE, May 1992, 7 pages.

"It's a Multithreaded World, Part 2," Charles J. Northrup, BYTE, Jun. 1992, pp. 351-356.

"Weaving a Thread," Shashi Prasad, BYTE, Oct. 1995, pp. 173-174.

"Making Sense of Collaborative Computing," Mark Gibbs, Network World Collaboration, Jan. 10, 1994, 4 pages.

"Parallel Logic Simulation of VLSI Systems," Bailey, et al., ACM Computing Surveys, vol. 26, No. 3, Sep. 1994, pp. 255-294.

"Multithreaded Languages for Scientific and Technical Computing," Cherri M. Pancake, Proceedings of the IEEE, vol. 81, No. 2, Feb. 1993, pp. 288-304.

"Distributed Simulation Architecture, SW Environment, Enterprise Server Products," Purdue EE400 Presentation by Freyensee and Frankel, Nov. 9, 2000, 13 pages.

"BNF and EBNF: What are They And How Do They Work?," Lars Marius Garshol, Oct. 12, 1999, pp. 1-10.

"VCK: Verilog-C Kernel," Testbench Automation, Distributed by Verilog Simulation, Hardware-Software Co-verification, 2001 Avery Design Systems, Inc., 8 pages.

"Principles of Verilog PLI," Swapnajit Mittra, Silicon Graphics Incorporated, 1999, 10 pages.

"IEEE Standard Hardware Description Language Based on the Verilog® Hardware Description Language," IEEE, Dec. 12, 1995, 8 pages.

"Open Vera 1.0, Language Reference Manual," Version 1.0, Mar. 2001, pp. 4-1 to 4-34, pp. 5-1 to 5-32, 6-1 to 6-22, 7-1 to 7-24, 11-1 to 11-50, 12-1 to 12-8, 13-1 to 13-14, 14-1 to 14-20, 15-1 to 15-118.

"VLSI Designe of Bus Arbitration Module for the 68000 Series of Microprocessors," Ososanya, et al., IEEE, 1994, pp.398-402.

"A VHDL Standard Package for Logic Modeling," David R. Coelho, IEEE Design & Test of Computers, vol. 7, Issue 3, Jun. 1990, pp. 25-32.

"Corrected Settling Time of the Distributed Parallel Arbiter," M.M. Taub, PhD., IEEE Proceedings, Part E: Computers & Digitals, vol. 139, Issue 4, Jul. 1992, pp. 348-354.

Damani, Om, et al., "Fault-Tolerant Distributed Simulation," May 1998, Univ. Texas, 9 pages.

Tay, Seng Chuan, et al., Speculative Parallel Simulation with an Adaptive Throttle Sceme, 1997, IEEE, pp. 116-123.

Lee, K.C., "A Virtual Bus Architecture for Dynamic Parallel Processing Parallel and Distributed Systems," IEEE Transactions, vol. 4, Issue 2, Feb. 1993, pp. 121-130.

Lee, K.C., A Virtual Bus for Dynamic Parallel Processing Parallel and Distributed Processing, 1990, Proceedings of the Second IEEE Symposium on Dec, 9-13, 1990, pp. 736-743.

* cited by examiner

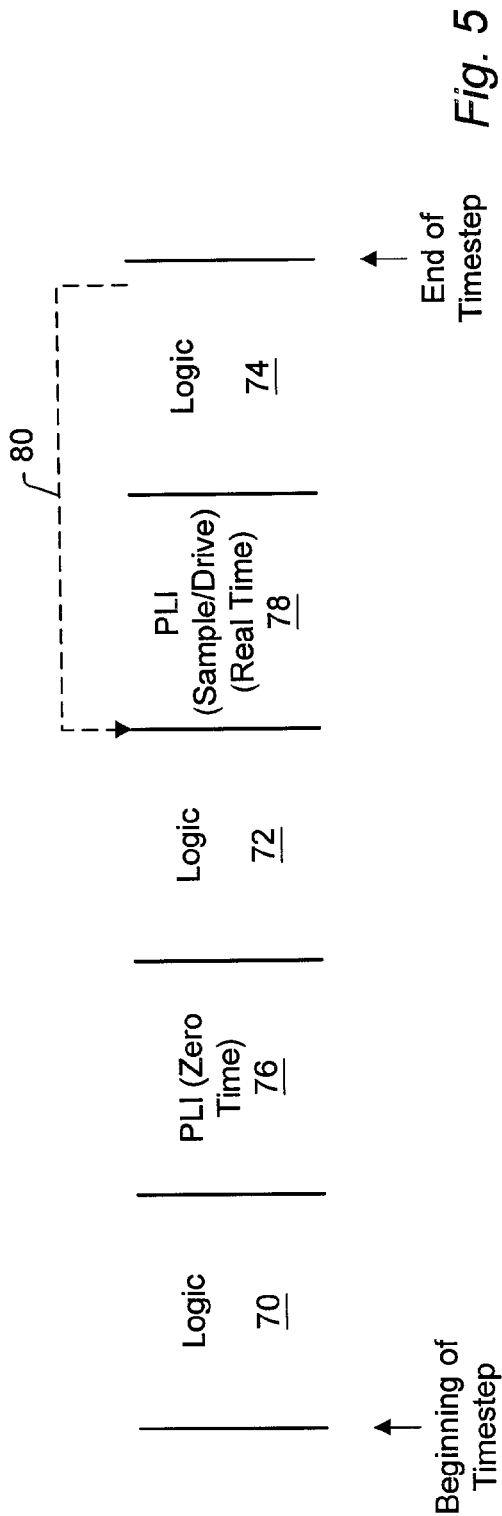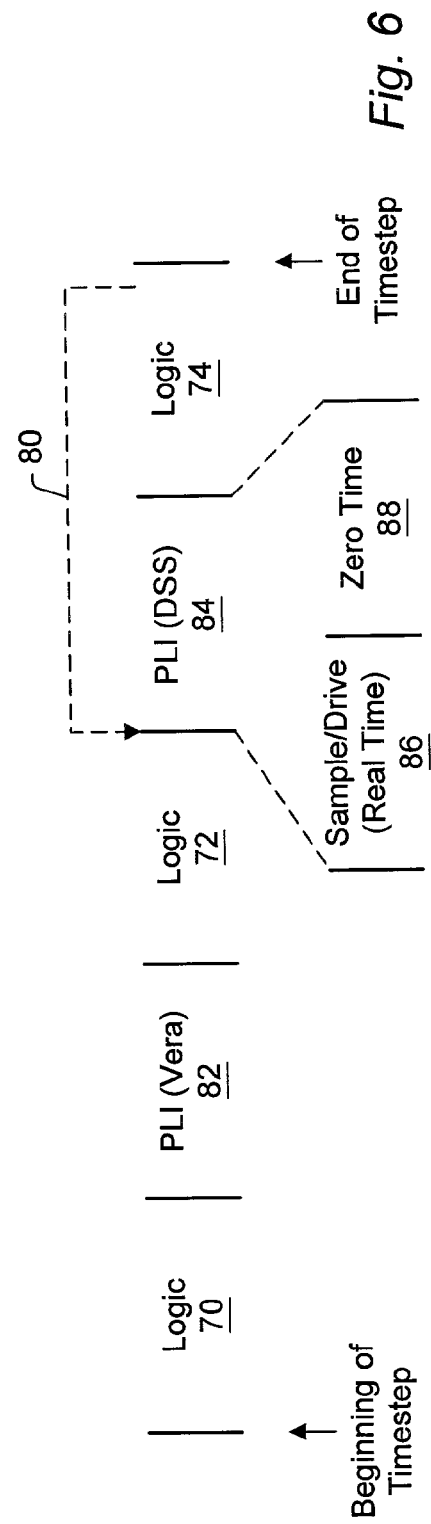

DISTRIBUTED SIMULATION SYSTEM HAVING PHASES OF A TIMESTEP

BACKGROUND OF THE INVENTION

1. Field of the Invention

This invention is related to the field of distributed simulation systems.

2. Description of the Related Art

Generally, the development of components for an electronic system such as a computer system includes simulation of models of the components. In the simulation, the specified functions of each component may be tested and, when incorrect operation (a bug) is detected, the model of the component may be changed to generate correct operation. Once simulation testing is complete, the model may be fabricated to produce the corresponding component. Since many of the bugs may have been detected in simulation, the component may be more likely to operate as specified and the number of revisions to hardware may be reduced. The models are frequently described in a hardware description language (HDL) such as Verilog, VHDL, etc. The HDL model may be simulated in a simulator designed for the HDL, and may also be synthesized, in some cases, to produce a netlist and ultimately a mask set for fabricating an integrated circuit.

Originally, simulations of electronic systems were performed on a single computing system. However, as the electronic systems (and the components forming systems) have grown larger and more complex, single-system simulation has become less desirable. The speed of the simulation (in cycles of the electronic system per second) may be reduced due to the larger number of gates in the model which require evaluation. Additionally, the speed may be reduced as the size of the electronic system model and the computer code to perform the simulation may exceed the memory capacity of the single system. As the speed of the simulation decreases, simulation throughput is reduced.

To address some of these issues, distributed simulation has become more common. Generally, a distributed simulation system includes two or more computer systems simulating portions of the electronic system in parallel. Each computer system must communicate with other computer systems simulating portions of the electronic system to which the portion being simulated on that computer system communicates, to pass signal values of the signals which communicate between the portions. Generally, distributed simulation systems sample output signals from the model in each node and communicate the corresponding signal states to other nodes. The received signal states are then driven as inputs to the models in those other nodes.

In such a simulation, skew may be experienced for some signals (as compared to the signals produced by the corresponding hardware). For example, signals which are asynchronous may change state at any time. A first node in the distributed simulation system may simulate a first model which drives a first output signal. The first output signal may be an input signal to a second model in a second node. The input signal to the second model may asynchronously cause a second output signal of the second model to change state during the same simulation timestep as the input signal is received. However, the second output signal is actually sampled in the next simulation time step (and thus the second output signal may affect receiving nodes in the next simulation time step). In contrast, in a single simulation image, the second output signal may affect receiving models in the same simulation timestep.

A glitch may be experienced for bi-directional signals (signals which may act as both inputs and outputs at different times). The bi-directional signal drivers may be located in different nodes, and thus the simulator in a given node may not have the states for all the drivers on a given bi-directional signal. Accordingly, resolving the value on the bi-directional signal line at a given time step may involve multiple nodes. Typically, the value on the bi-directional line from each node is transmitted to a central point, which resolves the value for the bi-directional line and transmits the resolved value to each of the nodes. However, simulator time progresses in each node while the central point is resolving the state, and the value on the bi-directional signal line in each node may be the value driven by the local model in that node until the central point returns the resolved value.

Test monitor code or test stimulation code is often used in distributed simulation systems. Frequently, such code may sample or change the values of various signals (or internal facilities such as registers) to determine if a simulation is operating properly or to cause a desired test event to occur. Such sampling and changing of values may also cause skew in the simulation. For example, reading a register may involve placing a value on the inputs of the model including the register. The input values are values which cause the model to output the register's contents. Simulator time may then advance by one or more timesteps to receive the register result.

SUMMARY OF THE INVENTION

A distributed simulation system is provided in which timesteps may be divided into a first phase and a second phase. In the first phase (referred to herein as "zero time"), each distributed simulation node in the system may process one or more received commands without causing the simulator to evaluate the model in that distributed simulation node. In the second phase (referred to herein as "real time"), each distributed simulation node may cause the simulator to evaluate the model in response to a command supplying one or more signal values to the model. In one embodiment, the second phase may iterate the evaluation of the model for each command received which supplies signal values. Each iteration may optionally include transmitting a command including the output signal values produced by the model during that iteration.

BRIEF DESCRIPTION OF THE DRAWINGS

The following detailed description makes reference to the accompanying drawings, which are now briefly described.

FIG. 5 is a timing diagram illustrating operation of one embodiment of a DSN during a simulation timestep.

FIG. 6 is a timing diagram illustrating operation of another embodiment of a DSN during a simulation timestep.

Figure 1:
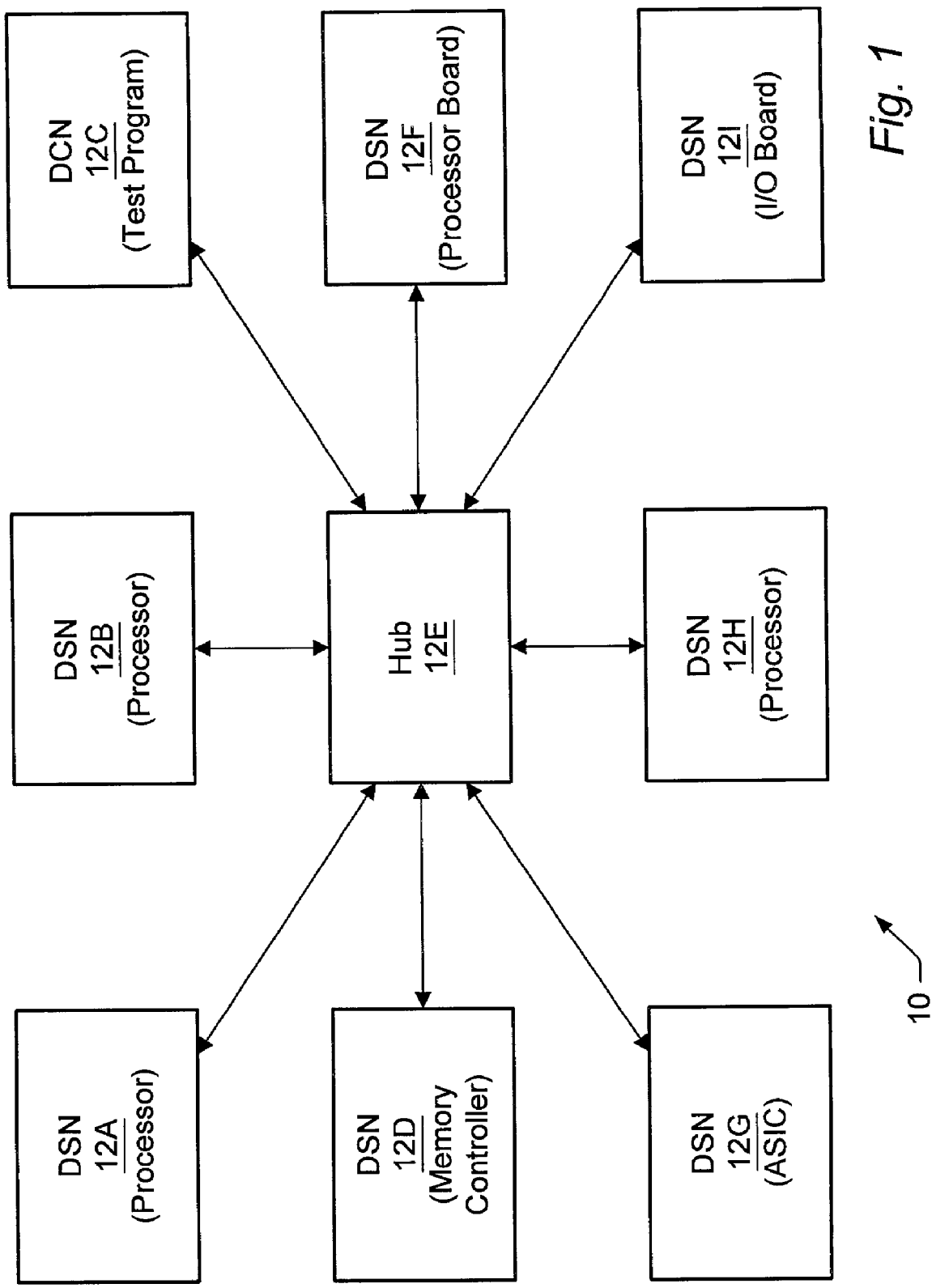
FIG. 1 is a block diagram of one embodiment of a distributed simulation system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Distributed Simulation System Overview

In the discussion below, both the computer systems comprising the distributed simulation system (that is, the computer systems on which the simulation is being executed) and the electronic system being simulated are referred to. Generally, the electronic system being simulated will be referred to as the "system under test".

Turning now to FIG. 1, a block diagram of one embodiment of a distributed simulation system 10 is shown. Other embodiments are possible and contemplated. In the embodiment of FIG. 1, the system 10 includes a plurality of nodes 12A–12I. Each node 12A–12D and 12F–12I is coupled to communicate with at least node 12E (which is the hub of the distributed simulation system). Nodes 12A–12B, 12D, and 12F–12I are distributed simulation nodes (DSNs), while node 12C is a distributed control node (DCN).

Generally, a node is the hardware and software resources for: (i) simulating a component of the system under test; or (ii) running a test program or other code (e.g. the hub) for controlling or monitoring the simulation. A node may include one or more of: a computer system (e.g. a server or a desktop computer system), one or more processors within a computer system (and some amount of system memory allocated to the one or more processors) where other processors within the computer system may be used as another node or for some other purpose, etc. The interconnection between the nodes illustrated in FIG. 1 may therefore be a logical interconnection. For example, in one implementation, Unix sockets are created between the nodes for communication. Other embodiments may use other logical interconnection (e.g. remote procedure calls, defined application programming interfaces (APIs), shared memory, pipes, etc.). The physical interconnection between the nodes may vary. For example, the computer systems including the nodes may be networked using any network topology. Nodes operating on the same computer system may physically be interconnected according to the design of that computer system.

A DSN is a node which is simulating a component of the system under test. A component may be any portion of the system under test. For example, the embodiment illustrated in FIG. 1 may be simulating a computer system, and thus the DSNs may be simulating processors (e.g. nodes 12A–12B and 12H), a processor board on which one or more of the processors may physically be mounted in the system under test (e.g. node 12F), an input/output (I/O) board comprising input/output devices (e.g. node 12I), an application specific integrated circuit (ASIC) which may be mounted on a processor board, a main board of the system under test, the I/O board, etc. (e.g. node 12G), a memory controller which may also be mounted on a processor board, a main board of the system under test, the I/O board, etc. (e.g. node 12D).

Depending on the configuration of the system under test, various DSNs may communicate. For example, if the processor being simulated on DSN 12A is mounted on the processor board being simulated on DSN 12F in the system under test, then input/output signals of the processor may be connected to output/input signals of the board. If the processor drives a signal on the board, then a communication between DSN 12A and DSN 12F may be used to provide the signal value being driven (and optionally a strength of the signal, in some embodiments). Additionally, if the processor being simulated on DSN 12A communicates with the memory controller being simulated on DSN 12D, then DSNs 12A and 12D may communicate signal values/ strengths.

A DCN is a node which is executing a test program or other code which is not part of the system under test, but instead is used to control the simulation, introduce some test value or values into the system under test (e.g. injecting an error on a signal), monitor the simulation for certain expected results or to log the simulation results, etc.

A DCN may communicate with a DSN to provide a test value, to request a value of a physical signal or other hardware modeled in the component simulated in the DSN, to communicate commands to the simulator in the DSN to control the simulation, etc.

The hub (e.g. node 12E in FIG. 1) is provided for routing communications between the various other nodes in the distributed simulation system. Each DSN or DCN transmits message packets to the hub, which parses the message packets and forwards message packets to the destination node or nodes for the message. Additionally, the hub may be the destination for some message packets (e.g. for synchronizing the simulation across the multiple DSNs and DCNs).

As mentioned above, the communication between the nodes 12A–12I may be in the form of message packets. The format and interpretation of the message packets is specified by a grammar implemented by the nodes 12A–12I. The grammar is a language comprising predefined commands for communicating between nodes, providing for command/ control message packets for the simulation as well as message packets transmitting signal values (and optionally signal strength information). Message packets transmitting signal values are referred to as signal transmission message packets, and the command in the message packet is referred to as a transmit command. The grammar may allow for more abstract communication between the nodes, allowing for the communication to be more human-readable than the communication of only physical signals and values of those signals between the nodes. As used herein, a physical signal is a signal defined in the simulation model of a given component of the system under test (e.g. an HDL model or some other type of model used to represent the given component). A logical signal is a signal defined using the grammar. Logical signals are mapped to physical signals using one or more grammar commands.

The grammar may include one or more commands for defining the configuration of the system under test. In one embodiment, these commands include a port of view (POV) command, a device description file (DDF) command, and a system configuration file (SCF) command. These commands may, in one implementation, be stored as files rather than message packets transmitted between nodes in the distributed simulation system. However, these commands are part of the grammar and may be transmitted as message packets if desired. Generally, the description below refers to the transmission of commands between nodes. The commands may be message packets in the above described embodiment, or any other form of transmission, as desired.

The POV command defines the logical port types for the system under test. Generally, signal information (which includes at least a signal value, and may optionally include a strength for the signal) is transmitted through a logical port in a message packet. That is, a message packet which is transmitting signal information transmits the signal information for one or more logical ports of a port type defined in the POV command. Accordingly, the POV command specifies the format of the signal transmission message packets. Generally, a logical port is an abstract representation of one or more physical signals. For example, the set of signals which comprises a particular interface (e.g. a predefined bus interface, a test interface, etc.) may be grouped together into a logical port. Transmitting a set of values grouped as a logical port may more easily indicate to a user that a communication is occurring on the particular interface than if the physical signals are transmitted with values.

In one embodiment, the logical ports may be hierarchical in nature. In other words, a given logical port may contain other logical ports. Accordingly, multiple levels of abstraction may be defined, as desired. For example, a bus interface which is pipelined, such that signals are used at different phases in a transaction on the bus interface (e.g. arbitration phase, address phase, response phase, etc.) may be grouped into logical ports for each phase, and the logical ports for the phases may be grouped into a higher level logical port for the bus as a whole. Specifically, in one embodiment, a logical port comprises at least one logical port or logical signal, and may comprise zero or more logical ports and zero or more logical signals in general. Both the logical ports and the logical signals are defined in the POV command. It is noted that the term "port" may be used below instead of "logical port". The term "port" is intended to mean logical port in such contexts.

The DDF command is used to map logical signals (defined in the POV command) to the physical signals which appear in the models of the components of the system under test. In one embodiment, there may be at least one DDF command for each component in the system under test.

The SCF command is used to instantiate the components of the system under test and to connect logical ports of the components of the system under test. The SCF command may be used by the hub for routing signal transmission message packets from one node to another.

While some embodiments may use logical signals for routing signal values between nodes, other embodiments may use physical signals. In such embodiments, the POV and DDF commands may not be used.

In addition to the above mentioned commands, the grammar may include a variety of other commands. For example, commands to control the start, stop, and progress of the simulation may be included in the grammar. Furthermore, a user command may be included which allows for an arbitrary string (e.g. code to be executed, or a message to code executing in a node) to be passed between nodes.

While the embodiment shown in FIG. 1 includes a node operating as a hub (node 12E), other embodiments may not employ a hub. For example, DSNs and DCNs may each be coupled to the others to directly send commands to each other. Alternatively, a daisy chain or ring connection between nodes may be used (where a command from one node to another may pass through the nodes coupled therebetween). In some embodiments including a hub, the hub may comprise multiple nodes. Each hub node may be coupled to one or more DSN/DCNs and one or more other hub nodes (e.g. in a star configuration among the hub nodes). In some embodiments, a DCN or DSN may comprise multiple nodes.

Figure 2:
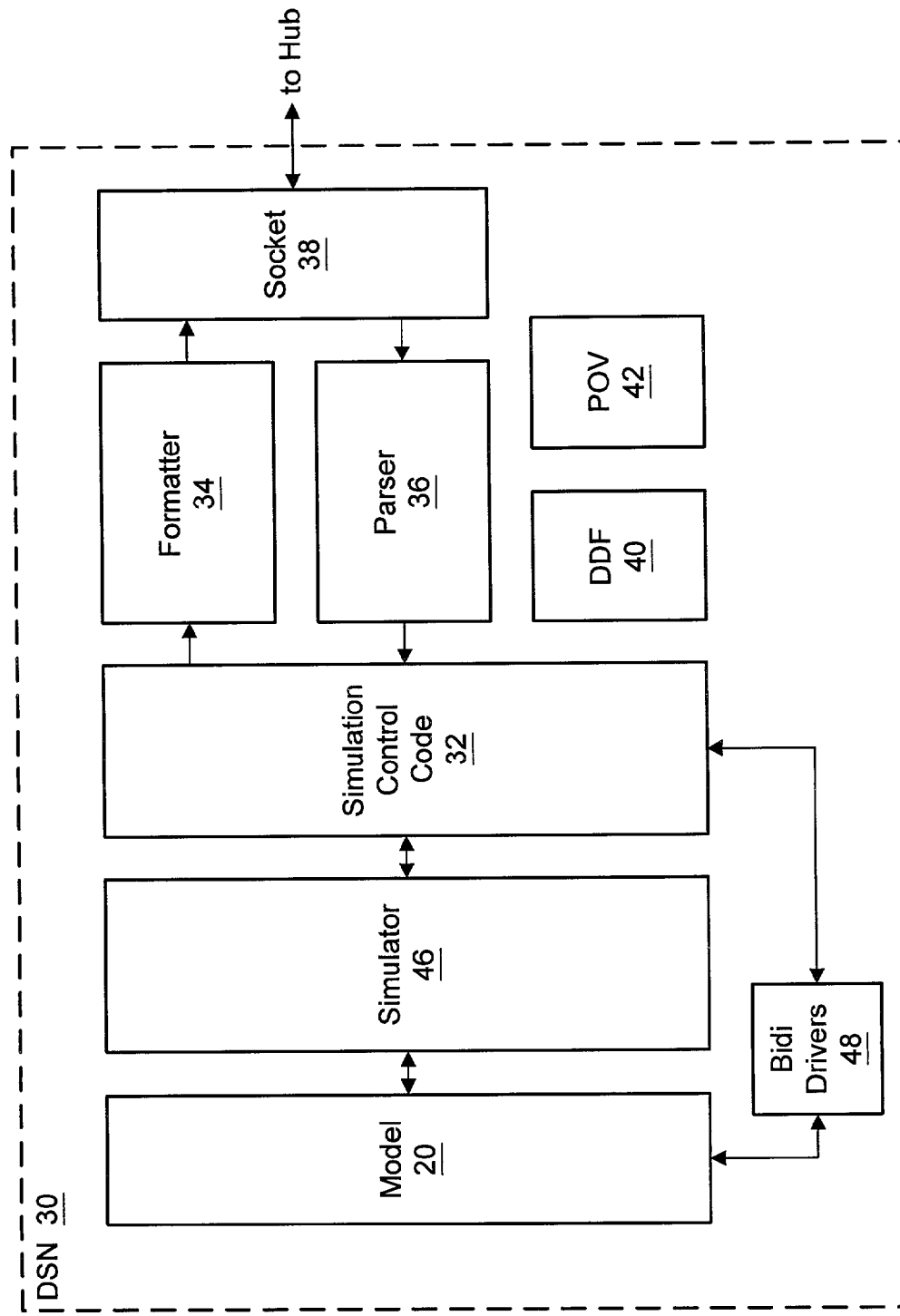
FIG. 2 is a block diagram of one embodiment of a distributed simulation node (DSN).

Turning now to FIG. 2, a block diagram of one embodiment of a DSN 30 is shown. The DSN 30 may be an example of the instruction code included in any of the DSNs 12A–12B, 12D, or 12F–12I shown in FIG. 1. Other embodiments are possible and contemplated. In the embodiment of FIG. 2, the DSN 30 includes a model 20, a set of bi-directional drivers (bidi drivers) 48, a simulator 46, simulation control code 32, a formatter 34, a parser 36, and a socket 38. Additionally, a DDF file 40 and a POV file 42 are shown. Each of the simulator 46, the simulation control code 32, the formatter 34, the parser 36, and the socket 38 comprise instruction sequences for performing various functions. While illustrated separately in FIG. 2, these instruction sequences may be combined, as desired. The illustration in FIG. 2 is a logical partitioning of the function which may not be maintained in the actual program code files, if desired.

Generally, the model 20 may be a simulatable model of a component of a system under test. The model may be an HDL model (e.g. a Verilog model, a VHDL model, etc.). The model may be a register transfer level (RTL) model of the design of the component. Alternatively, the model may be a behavioral description of the operation of the component, again written in HDL. The model may be a behavioral or functional model written in a verification language such as Vera®. Vera® may be a hardware verification language. A hardware verification language may provide a higher level of abstraction than an HDL. The model may also be coded in other languages (e.g. high level programming languages such as C or C++). It is further contemplated that a "model" could also be the hardware component, instantiated with interface logic allowing signals to be sampled and driven in response to the simulation.

The bidi drivers 48 may be used if the model 20 includes one or more bi-directional signals. One RTL driver circuit may be included for each bi-directional signal. The simulation control code 32 may place a value to be driven on a bi-directional signal (based on transmit commands received from other nodes having models coupled to the same bi-directional signal) and enable the driver to supply the proper state on the bi-directional signal.

The simulator 46 may generally be any commercially available simulator for the model 20. For example, Verilog embodiments may employ the NCVerilog program manufactured by Cadence Design Systems, Inc. (San Jose, Calif.); the VCS program manufactured by Synopsys, Inc. (Mountain View, Calif.); the VerilogXL simulator from Cadence; or the SystemSim program from Co-Design Automation, Inc. of Los Altos, Calif., among others. In one embodiment, the simulator 46 is an event driven simulator, although other embodiments may employ any type of simulator including cycle based simulators.

The simulation control code 32 is configured to interface with the simulator 46, the bidi drivers 48, the formatter 34, and the parser 36. The simulation control code 32 may include custom simulation code written to interface to the simulator, such as Vera® code which may be called at designated times during a simulation timestep by the simulator. The custom simulation code may include code to react to various grammar commands which may be transmitted to the DSN 30 from the hub.

The formatter 34 receives communication requests from the simulation control code 32 and formats the requests according to the grammar for transmission to the hub. In other words, the formatter 34 generates message packets containing commands defined in the grammar based on the communication requests. The parser 36 receives message packets from the socket 38 and parses the message packet according to the grammar.

The socket 38 may be a generic Unix socket implementation for communicating with the hub. While one socket 38 is shown with bi-directional communication with the hub, other embodiments may include two independent sockets, each communicating in one direction (sending or receiving) with the hub. Multiple unidirectional or bi-directional sockets may be used, as desired. The socket 38 may also be implemented using other Unix communication methods (e.g. shared memory, pipes, etc.).

The DDF and POV files 40 and 42 may store the DDF and POV commands for the DSN 30. Specifically, the DDF command may map the physical signals of the model 20 to logical signals specified in the POV command. The POV command may specify the logical signals and port types used by the DSN 30.

Figure 3:
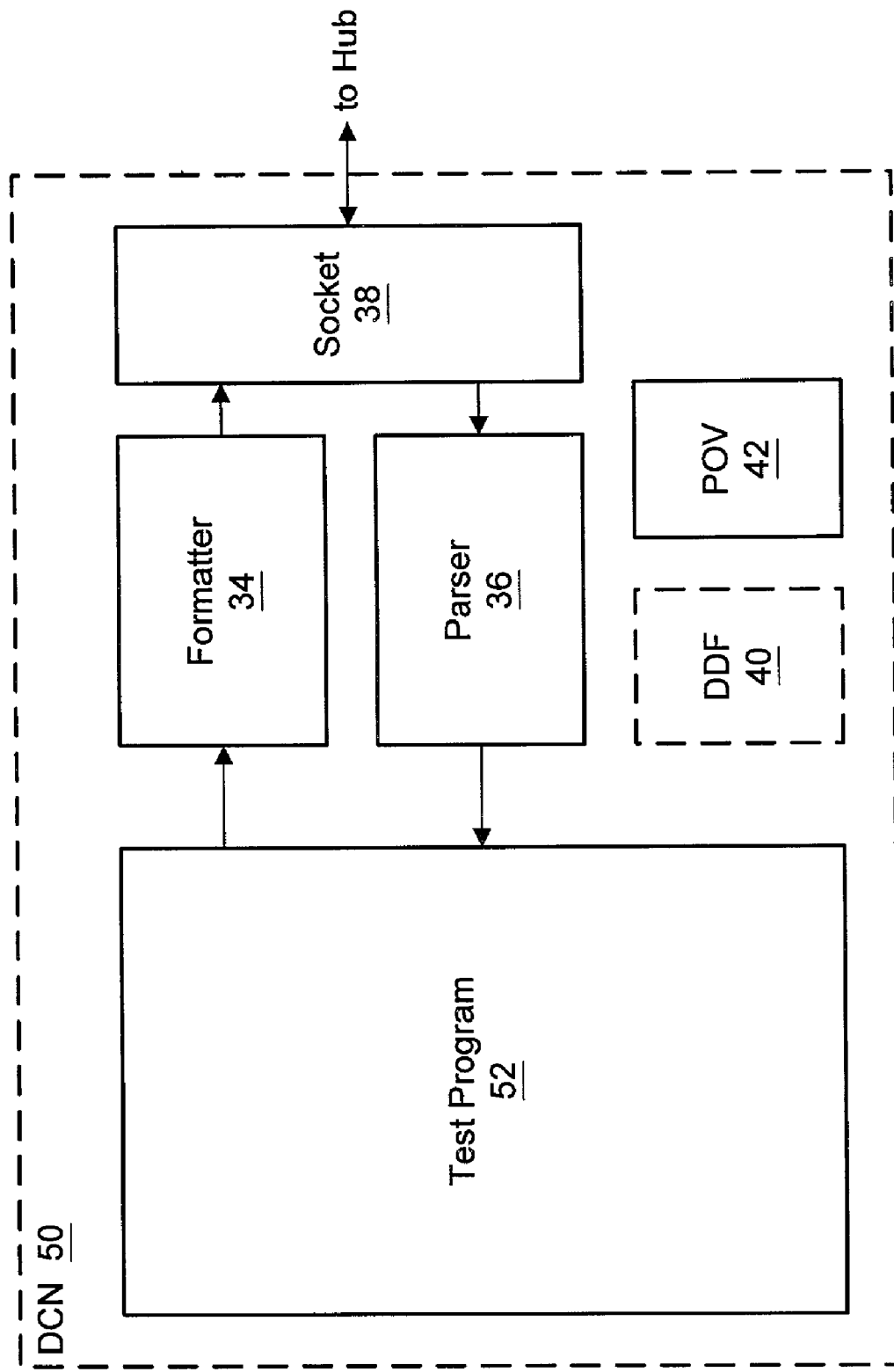
FIG. 3 is a block diagram of one embodiment of a distributed control node (DCN).

Turning now to FIG. 3, a block diagram of one embodiment of a DCN 50 is shown. The DCN 50 may be an example of the instruction code included in the DCN 12C shown in FIG. 1. Other embodiments are possible and contemplated. In the embodiment of FIG. 3, the DCN 50 includes a test program 52, the formatter 34, the parser 36, and the socket 38. Additionally, an optional DDF file 40 and the POV file 42 are shown. Each of the test program 52, the formatter 34, the parser 36, and the socket 38 comprise instruction sequences for performing various functions. While illustrated separately in FIG. 3, these instruction sequences may be combined, as desired. The illustration in FIG. 3 is a logical partitioning of the function which may not be maintained in the actual program code files, if desired.

The test program 52 may be programmed for any desired test operation. For example, the test program 52 may be configured to inject errors or provide non-error values at a given point or points in the system under test at a given time or times during the simulation. The test program 52 may be configured to transmit the error or non-error value as a signal transmission message packet at the given time, formatted according to the POV file 42 (by the formatter 34). The test program 52 may be configured to monitor for certain events in the simulation (e.g. by receiving signal transmission message packets from custom code in the desired DSN 30). Alternatively, the test program 52 may create one or more dummy physical signals for the signals to be monitored. The DDF file 40 may map the dummy physical signals to logical signals, and the SCF file in the hub may include a connection from the logical port of the node to be monitored to the logical port of the DCN 50. In general, any desired test operation may be performed by the test program 52.

The POV file 42 is used if the test program 52 transmits or receives signal transmission message packets, for formatting or parsing the packets, respectively. The DDF file 40 is optional, and may be used if the test program 52 creates dummy physical signals for monitoring purposes or other purposes.

Figure 4:
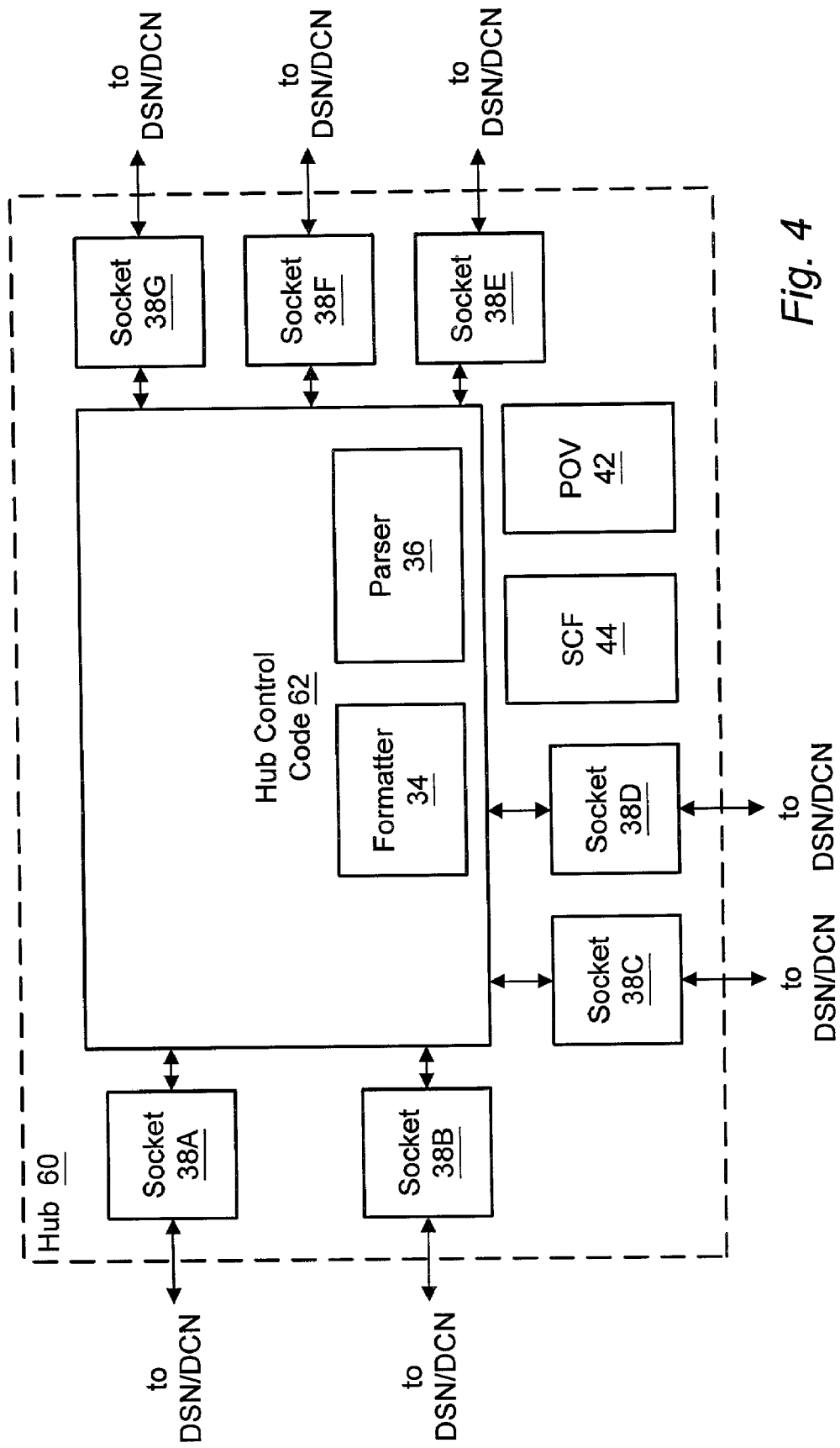
FIG. 4 is a block diagram of one embodiment of a hub.

Turning now to FIG. 4, a block diagram of one embodiment of a hub 60 is shown. The hub 60 may be an example of the instruction code included in the hub 12E shown in FIG. 1. Other embodiments are possible and contemplated. In the embodiment of FIG. 4, the hub 60 includes a hub control code 62 (which may include the formatter 34 and the parser 36), a set of sockets 38A–38G (the number of which may be equal to the number of DSNs and DCNs, or a multiple of the number if more than one socket is used per node), the POV file 42, and an SCF file 44. The sockets 38A–38G may each be similar to the socket 38 described above. Similar to the POV file 42 and the DDF file 40, the SCF file 44 may store the SCF command for the distributed simulation system. The hub control code 62 may use the SCF command to determine which nodes are to be instantiated at the beginning of the simulation, as well as the names of those nodes. The hub control code 62 may also use the routing information in the SCF command for routing signal transmission message packets. That is, the routing information is the information which specifies port connections in the system under test.

The hub control code 62 may generally receive message packets from the sockets 38A–38G. The hub control code 62 may process each message packet, which may result in generating message packets for other nodes (or for the source node of the message packet). For example, signal transmission message packets containing signals for a given logical port of the sending DSN may result in one or more signal transmission message packets to other nodes which are connected to the logical port in the SCF command. Other types of commands may be used by the hub itself (e.g. for synchronizing the DSNs during the simulation) or may be routed to other nodes (e.g. the user command described in more detail below). The hub control code 62 may use the parser 36 for parsing the received message packets and may use the formatter 34 for formatting the message packets to be transmitted, in a manner similar to the discussion above for DSNs and DCNs.

In one embodiment, the hub control code 62 may be multithreaded, with a separate thread for each socket. The thread may receive a message packet from the socket, and invoke the parser 36 to parse the message packet. The thread may also receive message packets from the formatter 34 for transmission on the corresponding socket 38A–38G. The parser 36 and formatter 34 may be shared among the threads, or there may be separate copies of the parser 36 and the formatter 34 for each thread.

Generally, a message packet is a packet including one or more commands and any arguments of each command. The message packet may be encoded in any fashion (e.g. binary, text, etc.). In one embodiment, a message packet is a string of characters formatted according to the grammar. The message packet may comprise one or more characters defined to be a command, followed by an opening separator character (defined to be an open brace in this embodiment, but any character may be used), followed by optional arguments, followed by a closing separator character (defined to be a close brace in this embodiment, but any character may be used).

It is noted that, while the above described embodiment abstracts physical signals to logical ports for communicating signal values between nodes, other embodiments may communicate the physical signal names and signal values (i.e. may not employ the logical ports).

Zero-Time and Real-Time Phases of a Timestep

The distributed simulation system 10 includes at least two phases within the simulation timestep: a zero time phase and a real time phase. During the zero time phase, DSNs, DCNs, and the hub may communicate with as many commands as desired (including commands which sample signals from the model or other facilities within the model and commands which change the values of the signals or the values in the facilities within the model) while the simulator is frozen. In other words, the DSNs do not cause the simulator to evaluate the model during the zero time phase (even if the received commands would otherwise cause scheduling of one or more events in the simulator). At the end of the zero time phase, any events scheduled as a result of activities in the zero time phase may be evaluated. As used herein, a facility of a model includes any internal structure or signal of the model which may be modified to cause an event within the model. A facility may also include a structure which monitors a signal or state of the model.

The zero time phase may be used to allow test programs (e.g. test program 52) to transmit multiple commands to the various DSNs and receive replies to those commands without the simulation progressing between the commands. Thus, for example, a first command may be sent to a DSN to read a first facility or signal value. Based on the returned value, the test program may send another command to read a second facility or signal value. Since the simulator is frozen, the state of the second facility or signal value is the same as it was when the first signal or facility value was read (and vice versa). Accordingly, for example, a DCN may assemble state information from multiple DSNs (or from a single DSN) using multiple commands and may be assured that the state returned for each command is consistent with the other state returned for the other commands (since the state of the simulation is frozen).

The real time phase includes the sampling and driving of signals from the model and may also include time in which the model is evaluating (e.g. in response to driving input signals in the drive phase). The real time phase may further include evaluation of one or more commands received by the node (e.g. reading or writing model facilities relative to the current real time state). The sample and drive of signals (and a subsequent evaluation of the model) may be iterated multiple times within a timestep. The sampling of signals includes reading the signal values from the model and transmitting one or more transmit commands with the sampled signal values. The driving of signals includes receiving one or more transmit commands with the driven signal values and applying those signal values to the model. The subsequent evaluation of the model determines if the driven signal values cause any changes to signal values within the current timestep (e.g. if the driven signal asynchronously changes an output signal) and may also schedule events for subsequent timestep(s) based on the driven signal values. If any output signals have changed, another phase of sampling and driving may occur. The sampling and driving may be repeated until each DSN does not detect any changes to its output signals in the current timestep, at which time the current timestep may terminate and the next timestep may begin. By iteratively sampling, driving, and evaluating the model, asynchronous signals may be handled within the timestep (if the asynchronous output changes during the timestep).

The iteration of sampling, driving, and model evaluation may also be used for bi-directional signals (along with the bidi drivers 48 shown in FIG. 2). In the first iteration within a first DSN, the value being driven on the bi-directional signal by the model 20 may be sampled (e.g. the value may be a binary one or zero, or a "Z" to indicate high impedance). The bidi drivers 48 may be disabled at the beginning of the time step to allow sampling of the value being driven by the model 20 (i.e. unaffected by the bidi drivers 48 driving a value on the bi-directional signal). The sampled value may be transmitted to other DSNs having the bi-directional signal. Additionally, the other DSNs may transmit the sampled values on the bi-directional signal to the first DSN. The first DSN may calculate the value to be driven by the bidi drivers 48 and provide the value to the bidi drivers 48. For example, if all the other DSNs provided a Z value, the bidi drivers 48 may drive a Z. If one or more other DSNs provided a binary one and none provided a binary zero, the bidi drivers 48 may drive a binary one. Similarly, if one or more other DSNs provided a binary zero and none provided a binary one, the bidi drivers 48 may drive a binary zero. If one or more other DSNs provided a binary one and one or more provided a binary zero, the bidi drivers 48 may drive an "X" (indicating unknown). The first DSN may enable the bidi drivers 48 to drive the value, and may schedule a callback to cause the sample/drive sequence to be iterated. In the next iteration, if the sample detects a difference on the bi-directional signal, the bi-directional signal may be carrying an "X" (if the model 20 is driving the opposite binary value of the bidi drivers 48). The "X" may be propagated to other nodes, and the next iteration of the sample/drive sequence may detect no change (allowing progression to the next time step).

In one embodiment, the sampling of signals may include sampling each of the output (and input/output) signals of the model. In another embodiment, the sampling of signals may be accomplished by having the simulator indicate which of the signals have changed value due to event evaluations, and sampling only the signals that have changed. For example, Verilog simulators may support a value change alert (VCA). The VCA may typically be used for monitoring certain signals of interest during a simulation. If a signal changes value and the VCA is set for that signal, the simulator may call a specified function. The distributed simulation system may use the VCA for each output (and input/output) signal to detect changes in the signals, and may sample only those signals which were indicated, via the VCA, as having changed state. Such a system may limit the sampling of signals to only those that have changed state. Still other embodiments may include a mode to select which of the above methods (sampling all signals or sampling only those for which the VCA has indicated a change) is used.

While the embodiments described below include both a zero time phase and a real time phase, other embodiments are contemplated that include only the real time phase (with iteration to re-evaluate the model for changes to the input signals from the previous iteration). Additionally, embodiments are contemplated in which both the real time and zero time phases are iterated.

Generally, a timestep is the granule of simulation time by which the simulator evaluates events and advances. In other words, the simulator 46 may be configured to perform a simulation as a series of timesteps. The granule may be a clock cycle, in cycle based simulators (i.e. all events within the clock cycle are evaluated to produce results at the end of the clock cycle). For event based simulators, such as simulators compliant with the IEEE 1364-1995 Verilog specification, the timestep may be any period of time. In one embodiment, the timestep may be selected to be a time interval which is less than or equal to a time interval corresponding to the lowest common multiple of the frequencies of clocks in the system under test multiplied by two (in accordance with Nyquist digital sampling theorem). Generally, events may include update events and evaluation events. An update event is a change in a signal value or register value. An evaluation event is the evaluation of a process (e.g. a circuit or other Verilog construct having the signal value as an input) which is sensitive to the update event. Events are scheduled either for the current simulation time or a future simulation time (a time beyond the current time by more than a timestep). The simulation time from a causal event to the resulting event is the approximate amount of actual time elapsing from the causal event to the corresponding circuitry generating the resulting event. The processing of all events which occur within a first timestep results in the end of the first timestep. In one embodiment, a tick timescale ('timescale) directive in Verilog is used to set the length of the timestep. Each Verilog model in the distributed simulation system may have the same tick timescale. As used herein, the phrase "evaluating the model" or "evaluating the logic" may refer to processing, by the simulator, of each of the then-scheduled events which occur in the current timestep.

Turning now to FIG. 5, a timing diagram of one embodiment of a timestep is shown. Other embodiments are possible and contemplated. In the embodiment of FIG. 5, the timestep includes several model evaluations (labeled "logic" in FIG. 5 and referred to below as logic evaluations) at reference numerals 70, 72, and 74. Also, a first programming language interface (PLI) call is performed (reference numeral 76), which forms the zero time phase in this embodiment. A second PLI call is made to perform signal sampling and driving (reference numeral 78). The sampling and driving is included in the real time phase, along with the logic evaluations.

In one embodiment, the PLI interface may be compatible with IEEE 1364-1995 standard. Generally, the PLI interface may comprise a set of simulator-defined and/or user-defined functions called by the simulator 46 at certain predefined points within the timestep. The code comprising the functions may be part of the simulation control code 32.

At the beginning of the timestep, the simulator 46 may evaluate all the scheduled events occurring within the simulation timestep (logic 70). The simulator 46 may then call the PLI function or functions forming the zero time phase (reference numeral 76). In these functions, any zero time communication that is desired (e.g. testing various model signals/resources and modifying signals/resources) may be performed. The simulator 46 may then evaluate events which may have been scheduled due to zero time operations (if any) (logic 72). For example, the zero time operations may have modified a signal or register value, which results in evaluation events for each sensitive process. After evaluating any zero-time-generated events, the second PLI call (reference numeral 78) to sample output signals (including bi-directional signals) and to drive input signals (including bi-directional signals) is performed. The PLI function or functions may include the communication with the hub (and thus with other nodes) to transmit output signal values and receive input signal values. If new input signal values are driven, the PLI function may communicate to the simulator (e.g. scheduling a callback) that the PLI functions are to be called again after evaluating the events caused by the new input signal values. Repeating the sample/drive call is shown as the dotted arrow 80 in FIG. 5.

The sample/drive PLI function may schedule the callback each time new signal values are applied to the model. Thus, if an output signal changes within the current timestep (e.g. asynchronously), then the new value of the output signal may be transmitted within the current timestep. Similarly, if an input signal changes asynchronously, the new value of the input signal may be applied to the model during the current timestep (during the next iteration of the sample/drive PLI function). Once a sample/drive sequence occurs in which no input signal changes are applied and no output signal values change, the sample/drive PLI function may not schedule the callback and the timestep may end (moving to the next timestep). Similarly, the bi-directional signals may be resolved through iterating the sample/drive sequence (as described above).

The embodiment of FIG. 5 performs the zero time phase once per timestep and may iterate the real time phase. Other embodiments are contemplated in which the zero time phase may also be iterated. One such embodiment is shown in FIG. 6. In the embodiment of FIG. 6, the logic evaluations 70, 72, and 74 are included similar to FIG. 5. However, instead of having the zero time phase between the logic evaluations 70 and 72, a PLI call for Vera® test code is provided (reference numeral 82). This PLI call is optional and may be eliminated (along with the logic evaluation 72) in other embodiments. The call to the Vera® test code may typically be provided as shown in FIG. 6. Additionally, a PLI call used by the distributed simulation system (DSS) is provided (reference numeral 84). The PLI call 84 is shown in exploded view and may include both the real time phase sampling and driving the signals of the model (reference numeral 86) and the zero time phase for communicating similar to the reference numeral 76 in FIG. 5 (reference numeral 88). Subsequently, the logic evaluation 74 may occur and the optional callback may be performed (arrow 80) as discussed above. Since both the zero time and real time phases are included in the PLI call 84, both phases are iterated in the embodiment of FIG. 6.

While the embodiment of FIG. 6 illustrates the real time phase followed by the zero time phase within the PLI call 84, other embodiments may have the zero time phase precede the real time phase. Additionally, the iteration of zero time and real time phases may be separate in other embodiments (e.g. a timing diagram similar to FIG. 5 in which there is a callback from the logic evaluation 72 to the zero time PLI call 76). An embodiment similar to FIG. 5 is also contemplated in which the zero time phase is performed at reference numeral 78 and the real time phase is performed at reference numeral 76.

It is noted that the IEEE 1364-1995 standard (and other standards related to Verilog) may be indeterminate with respect to the relationship between the evaluation of non-blocking assignment events and the PLI call, allowing the non-blocking assignment events to be evaluated either before or after the PLI call. If a simulator evaluating the non-blocking assignment events after the PLI call is used, some embodiments may force the scheduling of the PLI call after the non-blocking assignments have been assessed.

Turning next to FIGS. 7–10, flowcharts are shown illustrating operation of the DSN 30 (and more particularly the simulation control code 32, for the embodiment shown in FIG. 2) and the hub 60 (and more particularly the hub control code 62, for the embodiment shown in FIG. 4) during the zero time and real time phases of a timestep. The flowcharts refer to certain types of commands which may be defined by the grammar implemented by the distributed simulation system. In one embodiment, the grammar includes at least a real time done command (RT_Done) used by the hub to indicate to each of the DSNs/DCNs that the real time phase is complete for the current time step, a zero time done command (ZT_Done) used by the hub to indicate to each of the DSNs/DCNs that the zero time phase is complete for the current time step, a NOP command which indicates no-operation by the sender of the command, and a transmit command used to transmit signal values from one node to another. Any other commands may be included as desired. Specifically, a user command may be included (in which the command is followed by a string of characters used as a command to the receiving code, e.g. the simulation control code 32). The user command may be used in zero time to read and write model signals/facilities.

It is noted that the flowcharts of FIGS. 7–10 illustrate instruction code which is not a part of the simulator 46, in the present embodiment. The instruction code may be implemented as one or more callback functions in a callback table used by the simulator to call functions at various points during each timestep. In other embodiments, the instruction code illustrated in FIGS. 7–10 may be integrated as part of the simulator 46.

Figure 7:
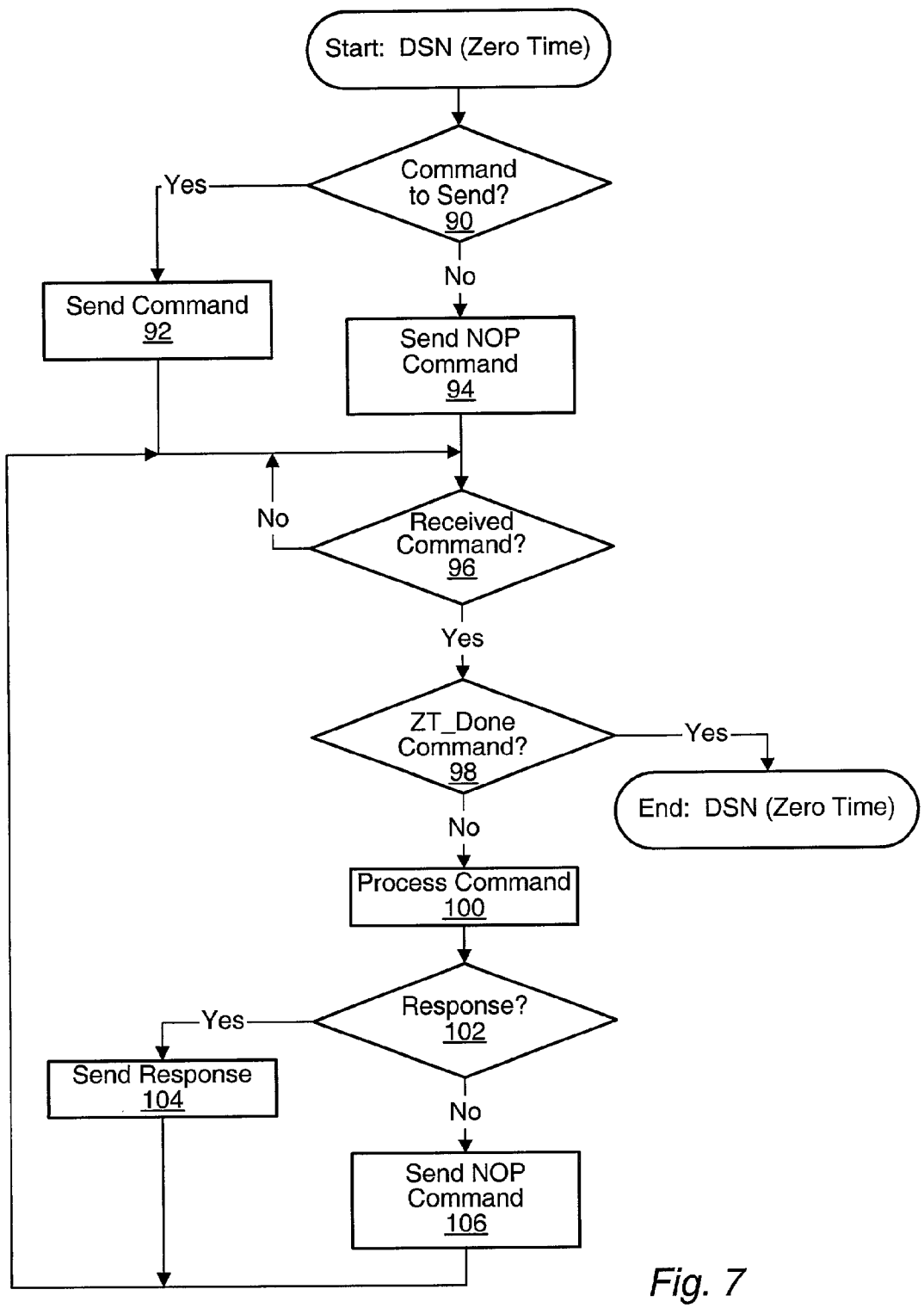
FIG. 7 is a flowchart illustrating operation of one embodiment of a DSN during a zero time phase of a simulation timestep.

Turning now to FIG. 7, a flowchart is shown illustrating operation of one embodiment of the DSN 30 (and more particularly the simulation control code 32, for the embodiment of FIG. 2) during the zero time phase of a timestep. Other embodiments are possible and contemplated. While the blocks are shown in FIG. 7 in a particular order for ease of understanding, other orders may be used. Furthermore, blocks may be performed in parallel. The blocks shown in FIG. 7 may represent instruction code which, when executed, performs the blocks shown in FIG. 7. A DCN 50 may operate in a similar fashion.

The DSN 30 determines if it has a command to send (decision block 90). The DSN 30 may initially have a command to send if, for example, the DSN 30 includes test code which is designed to transmit commands (e.g. signal or facility values) to another node (e.g. a DCN). If the DSN 30 has a command to send, the DSN 30 sends the command to the hub 60 (block 92). If the DSN 30 does not have a command to send, the DSN 30 sends a NOP command to the hub 60 (block 94). As will be seen below, the hub 60 receives a command from each node before transmitting commands to the nodes in the present embodiment, and thus the NOP command is sent to provide a command from the DSN 30 to the hub 60.

The DSN 30 waits to receive a command (decision block 96). The waiting may be accomplished in a variety of fashions. For example, the decision block 96 may represent polling for a command, or may represent the DSN 30 being inactive ("asleep") until the command is received.

If the command is the zero time done (ZT_Done) command (decision block 98), then the zero time phase is complete for this timestep. The code may exit (e.g. return to the simulator 46).

If the command is not the zero time done (ZT_Done) command, the DSN 30 may process the command (block 100). For example, if the command requests signal or facility values, the DSN 30 may access the signal/facility to return the corresponding value. If the command supplies signal or facility values to be applied to the model, the DSN 30 may schedule an event to change the signal/facility value.

If the command requires a response (e.g. to supply the signal/facility values or to acknowledge the supplied signal/facility values—decision block 102), the DSN 30 transmits the response (block 104). Otherwise, the DSN 30 transmits the NOP command (block 106). In either case, the DSN 30 waits for another command (decision block 96).

Figure 8:
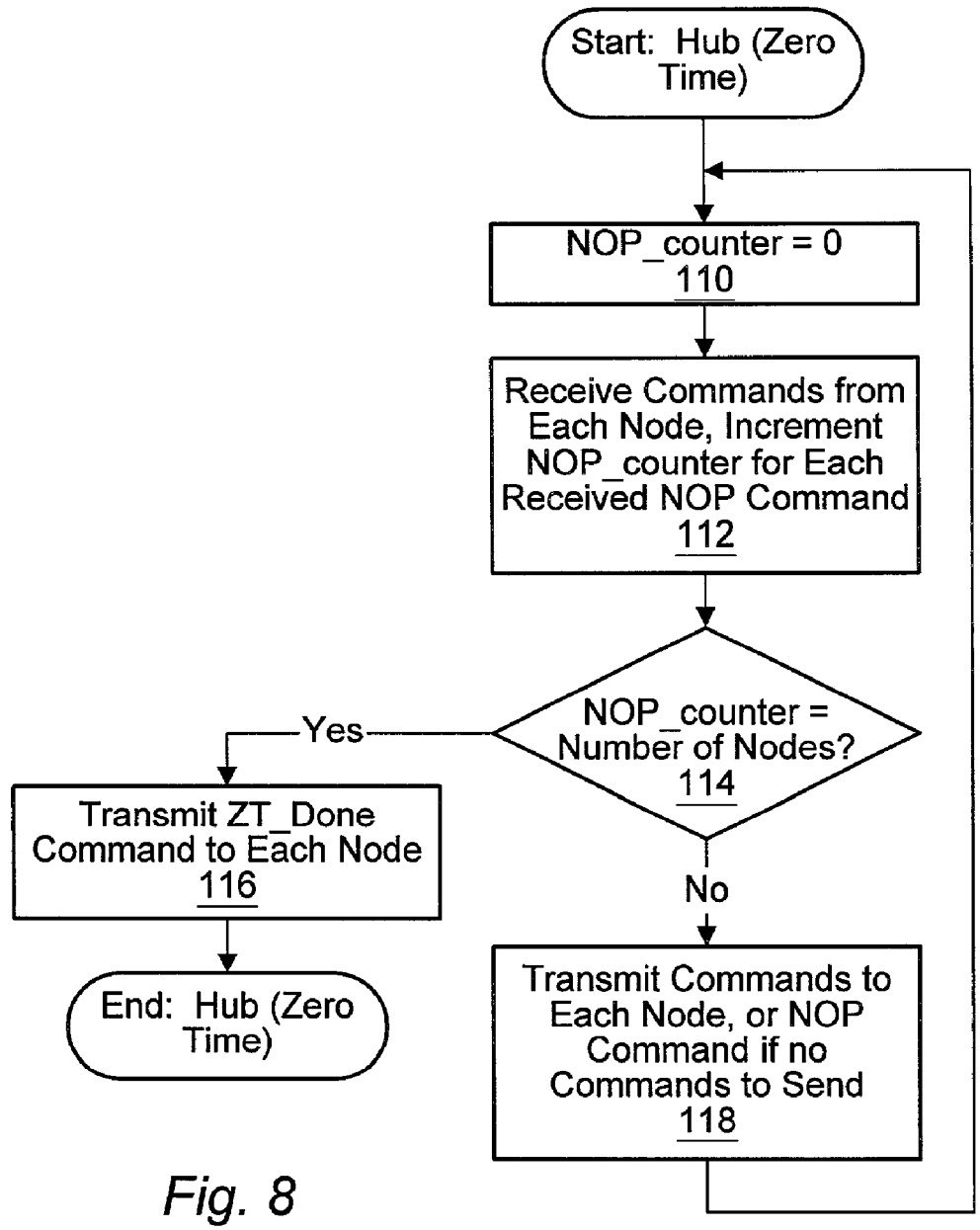
FIG. 8 is a flowchart illustrating operation of one embodiment of a hub during a zero time phase of a simulation timestep.

Turning now to FIG. 8, a flowchart is shown illustrating operation of one embodiment of the hub 60 (and more particularly the hub control code 62, for the embodiment of FIG. 4) during the zero time phase of a timestep. Other embodiments are possible and contemplated. While the blocks are shown in FIG. 8 in a particular order for ease of understanding, other orders may be used. Furthermore, blocks may be performed in parallel. The blocks shown in FIG. 8 may represent instruction code which, when executed, performs the blocks shown in FIG. 8.

The hub 60 sets a NOP_counter variable to zero (block 110). The NOP_counter variable is used to count the number of NOP commands which are received by the hub 60. The hub then waits to receive a command from each node (block 112). Since each node sends one command and then waits for a command from the hub in the present embodiment, the hub may increment a counter for each received command and determine that each node has sent a command when the counter reaches the number of nodes in the distributed simulation system. Alternatively, the counter may be initialized to the number of nodes and decremented for each received command, and the counter reaching zero indicates that a command has been received from each node. The hub processes each received command, and may generate one or more commands for transmission to other nodes. For example, if a transmit command with signal values is received, the hub may generate transmit commands for each node which receives one or more of the signal values. In one embodiment, the transmit command indicates the logical ports being transmitted in a given packet and the hub may route the transmit command based on the connections of ports specified in the SCF command. If the command is the NOP command, the hub increments the NOP_counter.

Once a command has been received from each node, the hub checks the NOP_counter to see if the number of NOP commands received is equal to the number of DSN/DCN nodes in the distributed simulation system (decision block 114). If the number of NOP commands is equal to the number of DSN/DCN nodes, then the nodes have completed their zero time communication for this time step. Accordingly, the hub transmits the ZT_Done command to each of the nodes (block 116). The hub then exits the zero time phase (and, in the present embodiment, enters the real time phase illustrated in FIG. 10).

If at least one node did not send the NOP command, the hub sends a command to each DSN/DCN node (block 118). The command may be a transmit command including signal values transmitted by one or more other nodes. If transmit commands were transmitted from multiple other nodes, the commands may be gathered together by the hub 60. The command may be another command routed from one node to another. If there are no commands to route to a given DSN/DCN, the hub transmits the NOP command to the given DSN/DCN. The hub then returns to reset the NOP_counter to zero and waits for commands from each node.

Generally, the embodiment of the hub 60 shown in FIG. 8 uses a synchronous method of determining when the zero time phase is complete. In the illustrated mechanism, the hub receives one command from each DSN/DCN prior to transmitting commands to each DSN/DCN. As illustrated in FIG. 7, a DSN sends either some type of command to be sent to another node, or a NOP command if no other command is to be sent. Thus, if each received command is a NOP command, zero time is complete (indicated by sending a ZT_Done command from the hub to each DSN/DCN). Otherwise, the hub transmits at least one command to each DSN/DCN (either a command routed from another node or a NOP command) and the hub then waits for commands. Other embodiments may transmit any fixed number of commands per node, or may allow a variable number of commands per node to be transmitted (e.g. one message packet may be transmitted, which may include one or more commands). Still further, a fully asynchronous communication mechanism may be used (with DSNs/DCNs sending commands as desired, and the hub forwarding the packets as received, until each DSN/DCN indicates that it is finished sending message packets (e.g. with a predefined ZT_Finish command), at which time the hub may transmit a ZT_Done command to each node to signify the end of the zero time phase).

Figure 9:
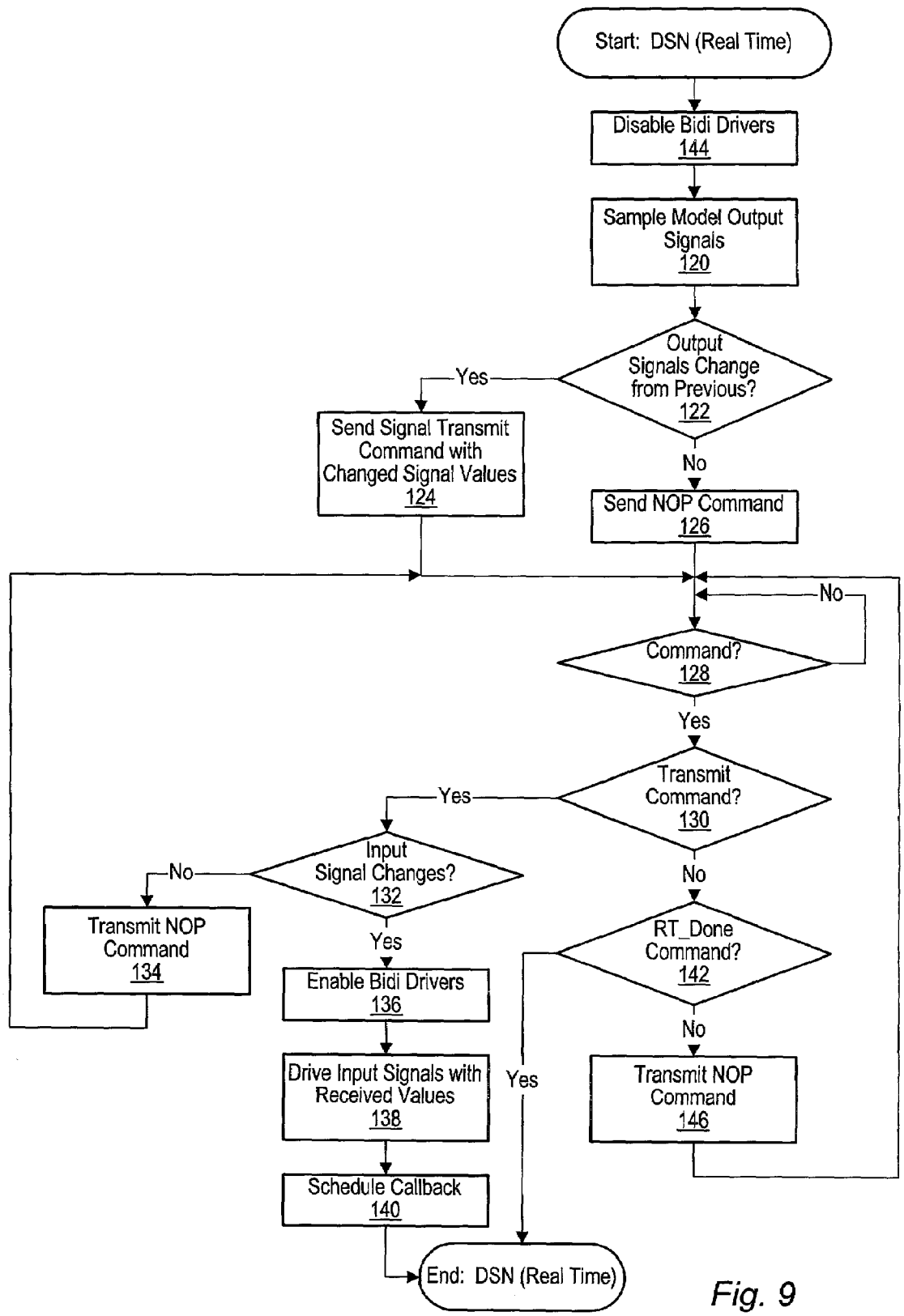
FIG. 9 is a flowchart illustrating operation of one embodiment of a DSN during a real time phase of a simulation timestep.

Turning next to FIG. 9, a flowchart is shown illustrating operation of one embodiment of the DSN 30 (and more particularly the simulation control code 32, for the embodiment of FIG. 4) during the real time phase of a timestep. Other embodiments are possible and contemplated. While the blocks are shown in FIG. 9 in a particular order for ease of understanding, other orders may be used. Furthermore, blocks may be performed in parallel. The blocks shown in FIG. 9 may represent instruction code which, when executed, performs the blocks shown in FIG. 9.

The DSN 30 may disable the bidi drivers 48, if applicable (so that the sample of the signals in block 120 results in sampling of the value being driven by the model 20, without any effect by the bidi drivers 48) (block 144).

The DSN samples the model output signals (block 120). Generally, the sampling of the output signals may include interfacing to the model 20 (either directly or through the simulator 46) to retrieve the output signal values. In one embodiment, the simulator 46 may support certain function calls from the PLI for retrieving signal values. The list of output signals (including bi-directional signals) may be extracted from the model as part of initializing the simulation, and the list may be used to extract the signal values. In one embodiment in which the logical ports are used, the extracted signal values may be mapped to the logical signal names and logical ports as well.

The DSN 30 compares the sampled output signal values to previously sampled output signal values to detect if any output signal values have changed from the previous sample (decision block 122). If one or more output signal values have changed, the DSN 30 transmits a transmit command with the changed signal values (block 124). Otherwise, the DSN 30 transmits a NOP command (block 126).

The DSN 30 waits to receive a command (decision block 128). The waiting may be accomplished in a variety of fashions. For example, the decision block 128 may represent polling for a command, or may represent the DSN 30 being inactive ("asleep") until the command is received.

If the received command is a transmit command (decision block 130), the DSN 30 examines the input signals and values provided in the transmit command to determine if any input signals to the model 20 have changed from previously driven values (decision block 132). If no changes are detected, the DSN 30 may transmit a NOP command and wait for additional commands to be sent. In this manner, evaluating the model and iterating the sample/drive sequence may be avoided in cases in which the signal values are not changed (and thus the evaluation of the model would result in no output signal changes). The DSN 30 waits for additional commands since, if a transmit command has been received, another node may be evaluating its model and may transmit an updated signal value for one or more input signals of the model 20. It is noted that, in some embodiments, checking for input signal changes may not be performed (e.g. the model may be evaluated and the sample/drive sequence may be iterated in response to receiving transmit commands which include no input signal changes for the model 20).

If the transmit command does include one or more input signal value changes, the DSN 30 may enable the bidi drivers 48 (to allow for any bi-directional signal changes to be driven onto the bi-directional signals) (block 136). The DSN 30 may further supply the input signal values to the simulator 46 for driving on the input signals (or to the bidi drivers 48 for bi-directional signals) (block 138). The DSN 30 may also cause a callback flag or other indication to be set in the simulator 46, to cause the iteration of the sample/drive sequence (block 140). Block 140 may comprise a function call to the simulator to schedule the callback, for example. Generally, by scheduling the callback, the block 140 causes the sample/drive sequence shown in FIG. 9 to be iterated again after the simulator 46 evaluates any events which may be caused by the new input signal values provided in the transmit command. The code may then exit to allow the simulator 46 to evaluate the model.

If the command is not a transmit command, the DSN 30 determines if the command is the RT_Done command signaling the end of the real time phase of the timestep (decision block 142). If the command is the RT_Done command, the code may exit (to be called again at the PLI stage in the next timestep).

If the command is not the RT_Done command, the command may be a NOP. The DSN 30 may transmit a NOP command (block 146) and wait for another command.

Figure 10:
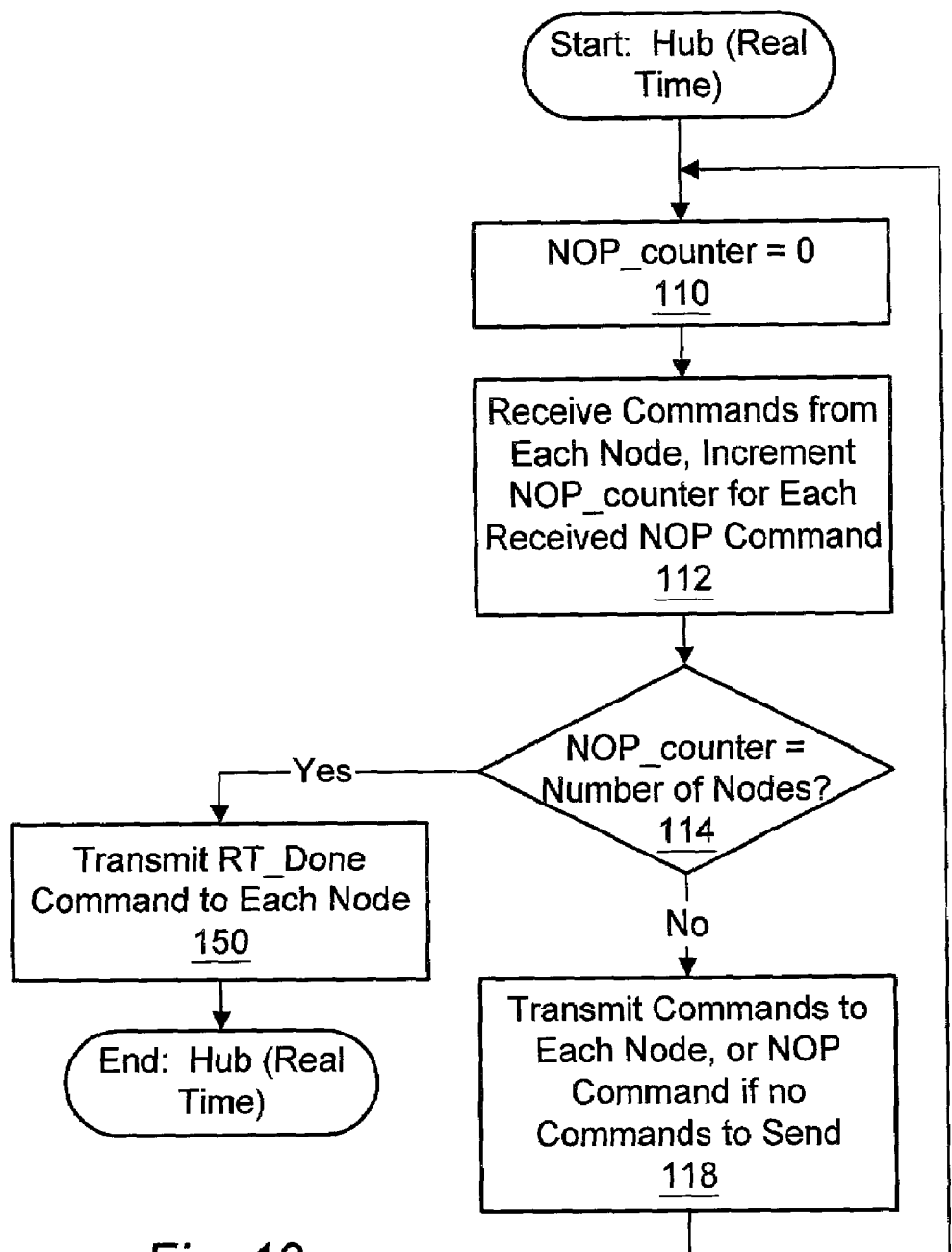
FIG. 10 is a flowchart illustrating operation of one embodiment of a hub during a real time phase of a simulation timestep.

Turning next to FIG. 10, a flowchart is shown illustrating operation of one embodiment of the hub 60 (and more particularly the hub control code 62, for the embodiment of FIG. 4) during the real time phase of a timestep. Other embodiments are possible and contemplated. While the blocks are shown in FIG. 10 in a particular order for ease of understanding, other orders may be used. Furthermore, blocks may be performed in parallel. The blocks shown in FIG. 10 may represent instruction code which, when executed, performs the blocks shown in FIG. 10.

In the embodiment shown, the hub 60 may operate in a similar fashion in the real time phase as the hub operates in the zero time phase. That is, the hub 60 may receive commands from each DSN/DCN, count the NOP commands, compare the number of NOP commands to the number of DSN/DCN nodes, and transmit commands to the nodes if the number of received NOP commands is not equal to the number of DSN/DCN nodes (blocks 110, 112, 114, and 118). However, in this case, a real time done (RT_Done) command is transmitted instead of a ZT_Done command to each node when the number of NOP commands received equals the number of DSN/DCN nodes (block 150). The code sequence then exits (e.g. to the zero time code illustrated in FIG. 8, in this embodiment).

Similar to the description above for FIG. 8, other embodiments of the hub 60 may transmit any fixed number of commands per node, or may allow a variable number of commands per node to be transmitted (e.g. one message packet may be transmitted, which may include one or more commands). Still further, a fully asynchronous communication mechanism may be used (with DSNs/DCNs sending commands as desired, and the hub forwarding the packets as received, until each DSN/DCN indicates that it is finished sending message packets (e.g. with a predefined RT_Finish command), at which time the hub may transmit an RT_Done command to each node to signify the end of the zero time phase).

Figure 11:
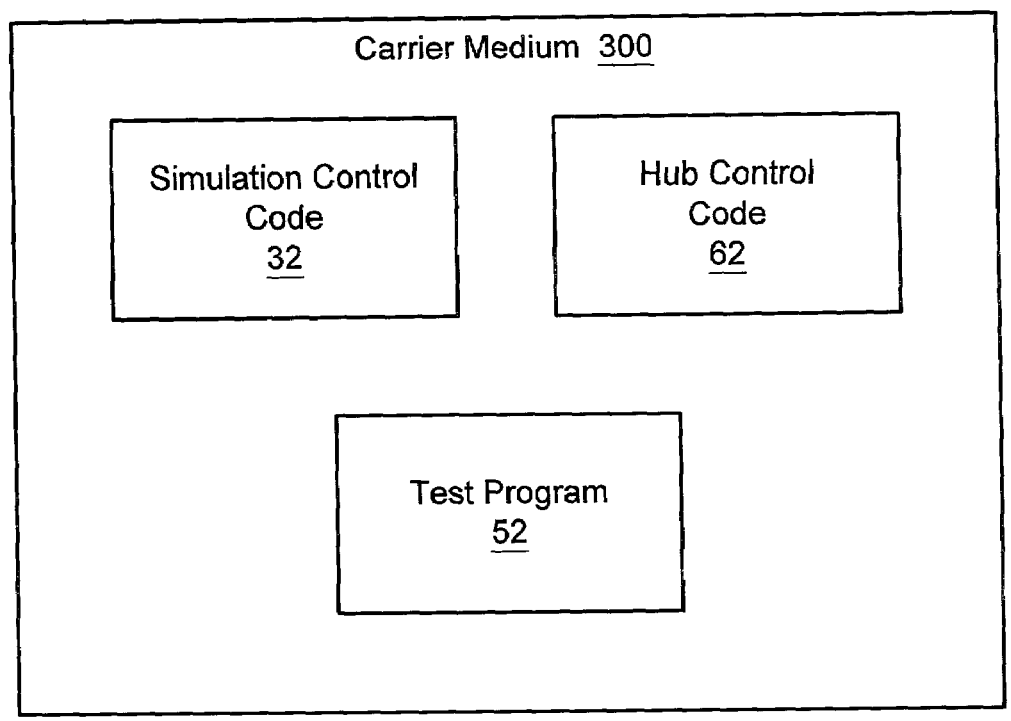
FIG. 11 is a block diagram of a carrier medium.

Turning next to FIG. 11, a block diagram of a carrier medium 300 is shown. Generally speaking, a carrier medium may include computer readable media such as storage media (which may include magnetic or optical media, e.g., disk or CD-ROM), volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

The carrier medium 300 is shown storing the simulation control code 32, the hub control code 62, and the test program 52. That is, the carrier medium 300 is storing instruction sequences corresponding to the simulation control code 32, the hub control code 62, and the test program 52. Other embodiments may store only one of the simulation control code 32, the hub control code 62, and the test program 52. Still further, other code sequences may be stored (e.g. the simulator 46, the formatter 34, the parser 36, the sockets 38). Additionally, the model 20 and/or the bidi drivers 48 may be stored.

The carrier medium 300 as illustrated in FIG. 11 may represent multiple carrier media in multiple computer systems on which the distributed simulation system 10 executes. For example, the simulation control code 32 may be on a carrier medium in a first computer system on which a given DSN executes, and the hub control code 62 may be on a different carrier medium in a second computer system on which the hub executes.

Numerous variations and modifications will become apparent to those skilled in the art once the above disclosure is fully appreciated. It is intended that the following claims be interpreted to embrace all such variations and modifications.

What is claimed is:

1. A distributed simulation system comprising a plurality of nodes, wherein each node of the plurality of nodes simulates, during use, a different portion of a system under test using a simulator program that performs a simulation as a series of timesteps, and wherein each timestep includes at least a first phase and a second phase, and wherein the plurality of nodes enter each phase concurrently and exit each phase concurrently, during use, and wherein the plurality of nodes exit each phase in response to a command indicating that the phase is complete, and wherein each node of the plurality of nodes causes the simulator program to not evaluate a model of the different portion of the system under test during the first phase even if one or more commands are received by that node during the first phase, during use, and wherein each node of the plurality of nodes causes the simulator program to evaluate the model during the second phase in response to receiving a command during the second phase, during use, the command including one or more signal values for signals of the model, wherein the simulation of the system under test produces a result that includes signal values of the system under test at each timestep in the series of timesteps, and logs the result into a file, during use.

2. The distributed simulation system as recited in claim 1 wherein each node of the plurality of nodes causes the simulator program to not evaluate the model during the second phase if the signal values in the command received by that node are the same as the current values of the signals, during use.

3. The distributed simulation system as recited in claim 1 wherein each node of the plurality of nodes, if one or more output signals of the model change in response to evaluating the model, transmits a command including at least the signal values of the output signals that change, during use.

4. The distributed simulation system as recited in claim 1 wherein each node of the plurality of nodes causes the simulator program to evaluate the model two or more times during the second phase in response to two or more commands including signal values, during use.

5. The distributed simulation system as recited in claim 1 further comprising a hub coupled to the plurality of nodes, wherein, during use, the hub receives at least one command from each node during the first phase prior to transmitting commands to the plurality of nodes during the first phase.

6. The distributed simulation system as recited in claim 5 wherein each node of the plurality of nodes transmits a no-operation command, during use, to the hub if that node has no other command to transmit.

7. The distributed simulation system as recited in claim 5 wherein the hub transmits at least one command to each node of the plurality of nodes, during use.

8. The distributed simulation system as recited in claim 7 wherein a first command transmitted by the hub to a first node of the plurality of nodes corresponds to a second command received from one of the plurality of nodes if the second command is routed to the first node, and wherein the first command is a no-operation command otherwise.

9. The distributed simulation system as recited in claim 1 further comprising a hub coupled to the plurality of nodes, wherein the hub, during use, receives at least one command from each node during the second phase prior to transmitting commands to the plurality of nodes during the second phase.

10. The distributed simulation system as recited in claim 9 wherein each node of the plurality of nodes transmits a no-operation command to the hub if that node has no other command to transmit, during use.

11. The distributed simulation system as recited in claim 9 wherein the hub transmits at least one command to each node of the plurality of nodes, during use.

12. The distributed simulation system as recited in claim 11 wherein a first command transmitted by the hub to a first node of the plurality of nodes corresponds to a second command received from one of the plurality of nodes if the second command is routed to the first node, and wherein the first command is a no-operation command otherwise.

13. The distributed simulation system as recited in claim 1 further comprising a hub coupled to the plurality of nodes, and wherein the hub, during use, signals an end of each of the first phase and the second phase.

14. The distributed simulation system as recited in claim 13 wherein, during use, the hub receives at least one command from each node prior to transmitting commands to the plurality of nodes, and wherein, during use, the hub signals an end to one of the first phase or the second phase responsive to receiving a no-operation command from each of the plurality of nodes.

15. A computer readable medium storing instructions which,
when executed on a computer, process a first one or more commands received during a first phase of a timestep without causing a simulator program to evaluate a model, and cause the simulator program to evaluate the model during a second phase of the timestep in response to receiving a second command including one or more signal values for signals of the model,
wherein the second command is received during the second phase of the timestep, and wherein the instructions, when executed, exit one of the first phase and second phase in response to receiving a third command indicating that the phase is complete,
wherein the model represents a portion of a system under test and
wherein the simulation of the system under test produces a result that includes signal values of the system under test at the timestep, and logs the result into a file.

16. The computer readable medium as recited in claim 15 wherein the instructions, when executed, do not cause the simulator program to evaluate the model during the second phase if the signal values in the second command are the same as the current values of the signals in the model.

17. The computer readable medium as recited in claim 15 wherein the instructions, when executed, if one or more output signals of the model change in response to evaluating the model, transmit a command including at least the signal values of the output signals that change.

18. The computer readable medium as recited in claim 17 wherein the instructions, when executed, if no output signals change value during the second phase, transmit a no-operation command.

19. The computer readable medium as recited in claim 15 wherein the instructions, when executed, cause the simulator program to evaluate the model two or more times during the second phase in response to two or more commands including signal values and optional signal strengths.

20. The computer readable medium as recited in claim 15, wherein the instructions, when executed, return to the simulator program in response to a third command indicating an end of the first or second phase.

21. A computer readable medium storing instructions which,
when executed on a computer, signal an end of either a first phase or a second phase of a timestep in a distributed simulation system by transmitting a predefined command indicating an end of the first phase or the second phase to each of a plurality of nodes in the distributed simulation system, and
wherein the instructions, when executed on the computer, signal the end of either the first phase or the second phase responsive to receiving a no-operation packet from each of the plurality of nodes subsequent to transmitting a command other than a no-operation packet to at least one of the plurality of nodes,
wherein the distributed simulation system simulates a system under test, producing a result that includes signal values of the system under test at the timestep, and logs the result into a file.

22. The computer readable medium as recited in claim 21 wherein the instructions, when executed on the computer, route commands from one of the plurality of nodes to others of the plurality of nodes.

23. A method comprising:
receiving a first one or more commands in a node of a distributed simulation system during a first phase of a timestep;
processing the first one or more commands without causing a simulator program to evaluate a model;
receiving a second command during a second phase of the timestep;
processing the second command including causing the simulator program to evaluate the model if the second command includes one or more signal values for signals of the model;
receiving a third command indicating that one of the first phase and the second phase is complete; and
exiting the indicated phase in response to the third command,
wherein the distributed simulation system simulates a system under test, producing a result that includes signal values of the system under test at the timestep, and logs the result into a file.

24. The method as recited in claim 23 wherein processing the second command does not include causing the simulator program to evaluate the model if the signal values in the second command are the same as the current values of the signals in the model.

25. The method as recited in claim 23 further comprising, if the evaluation of the model during the second phase results in one or more output signals of the model changing, transmitting a command including at least the signal values of the output signals that change.

26. The method as recited in claim 25 further comprising, if no output signals change value during the second phase, transmitting a no-operation command.

27. The method as recited in claim 23 further comprising causing the simulator program to evaluate the model two or more times during the second phase in response to two or more commands including signal values.

28. The method as recited in claim 23 further comprising, in response to a command indicating an end of the first or second phase, returning to the simulator program.

29. A method comprising:
signaling an end of a first phase of a timestep in a distributed simulation system by a hub of the distributed simulation system, the signaling including transmitting a predefined command to each of a plurality of nodes in the distributed simulation system,
wherein signaling the end of the first phase is responsive to receiving a no-operation packet from each of the plurality of nodes subsequent to transmitting a command other than a no-operation packet to at least one of the plurality of nodes; and
signaling an end of a second phase of a timestep in a distributed simulation system by the hub, the signaling including transmitting a predefined command to each of the plurality of nodes in the distributed simulation system,
wherein the distributed simulation system simulates a system under test, producing a result that includes signal values of the system under test at the timestep, and logs the result into a file.

30. The method as recited in claim 29 wherein signaling the end of the second phase is responsive to receiving a no-operation packet from each of the plurality of nodes subsequent to transmitting a command other than a no-operation packet to at least one of the plurality of nodes.

31. A distributed simulation system comprising a plurality of nodes,
wherein each node of the plurality of nodes simulate a different portion of a system under test using a simulator program perform a simulation as a series of timesteps, during use, and
wherein the plurality of nodes communicate using commands, during use, and a first node of the plurality of nodes causes the simulator program to evaluate the model in response to receiving a first command including one or more signal values for signals of the model during a first timestep, during use, and
wherein the first node causes the simulator program to re-evaluate the model in response to receiving a second command including one or more signal values for signals of the model during the first timestep, during use, and
wherein the distributed simulation system simulates a system under test, during use, producing a result that includes signal values of the system under test at the timestep, and logs the result into a file.

* * * * *